United States Patent
Pelley et al.

(10) Patent No.: US 9,281,042 B1
(45) Date of Patent: Mar. 8, 2016

(54) NON-VOLATILE MEMORY USING BI-DIRECTIONAL RESISTIVE ELEMENTS AND CAPACITIVE ELEMENTS

(71) Applicants: Perry H. Pelley, Austin, TX (US); Frank K. Baker, Jr., Austin, TX (US); Ravindraraj Ramaraju, Round Rock, TX (US)

(72) Inventors: Perry H. Pelley, Austin, TX (US); Frank K. Baker, Jr., Austin, TX (US); Ravindraraj Ramaraju, Round Rock, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/572,780

(22) Filed: Dec. 17, 2014

(51) Int. Cl.
*G11C 13/00* (2006.01)
*G11C 11/16* (2006.01)
*G11C 11/24* (2006.01)

(52) U.S. Cl.
CPC ........ *G11C 11/1673* (2013.01); *G11C 11/1675* (2013.01); *G11C 13/0002* (2013.01); *G11C 13/0004* (2013.01); *G11C 11/24* (2013.01)

(58) Field of Classification Search
CPC .............. G11C 11/24; G11C 11/1673; G11C 11/1675; G11C 13/0002; G11C 13/0004; G11C 13/004; G11C 13/0069
USPC .................. 365/72, 148, 149, 158, 163, 189.2
See application file for complete search history.

(56) References Cited

U.S. PATENT DOCUMENTS

| | | | |
|---|---|---|---|
| 4,809,225 A | 2/1989 | Dimmler et al. | |
| 4,980,859 A | 12/1990 | Guterman et al. | |
| 6,625,056 B1 * | 9/2003 | Kihara | G11C 11/40 365/145 |
| 6,980,459 B2 | 12/2005 | Seshadri et al. | |
| 7,079,415 B2 | 7/2006 | Frey | |
| 8,638,599 B2 * | 1/2014 | Akiyama | G11C 11/1673 365/149 |
| 2011/0216571 A1 * | 9/2011 | Yamazaki | G11C 11/404 365/72 |

* cited by examiner

*Primary Examiner* — Tan T. Nguyen
(74) *Attorney, Agent, or Firm* — Valerie M. Davis; The Mason Group Patent Specialists, LLC

(57) ABSTRACT

A memory cell includes a bi-directional resistive memory element, a first transistor, and a capacitive element. The bi-directional resistive memory element has a first terminal directly connected to a first power rail and a second terminal coupled to an internal node. The first transistor has a control electrode coupled to the internal node, a first current electrode coupled to a first bitline, and a second current electrode coupled to one of the first power rail, a second power rail, or a read wordline. The capacitive element includes a first terminal coupled to the internal node and a second terminal coupled to the read wordline.

20 Claims, 9 Drawing Sheets

NON-VOLATILE MEMORY USING BI-DIRECTIONAL RESISTIVE ELEMENTS AND CAPACITIVE ELEMENTS

FIELD

The present disclosure relates in general to non-volatile memories, and more specifically to systems and methods for non-volatile memory that use bi-directional resistive elements and capacitive elements.

BACKGROUND

Memories with resistive storage elements are under development across the semiconductor industry. Such memories are geared to replace conventional random access memory (RAM) and non-volatile memory devices. The resistive memory devices include magnetoresistive random access memory (MRAM), resistive random-access memory (RRAM or ReRAM), and phase-change memory (PCM), among others. Most of the resistive memory devices are implemented in one transistor/one resistive element or one diode/one resistive element memory cell configurations, which provide minimal cell area but exhibit relatively slow read and write performance, for instance approximately 30 nanoseconds or more per operation. Thus, current resistive memory devices are not a viable substitute for much of the static RAM (SRAM) in a higher performance system where read/write operations occur within a few clock cycles. It is also difficult to produce a reliable one transistor/one resistive element or one diode/one resistive element memory.

Memory cells with one transistor and one resistive element may eventually replace embedded flash on future system on chips (SoCs), but it is desirable to use these same elements to replace the SRAM as well. Potentially, less flash would be needed, or the system could use a more efficient architecture, if the "fast" memory such as SRAM was also compact and non-volatile.

BRIEF DESCRIPTION OF THE DRAWINGS

In the accompanying figures, like reference numerals refer to identical or functionally similar elements throughout the separate views. The figures together with the detailed description below are incorporated in and form part of the specification. Moreover, the figures and the detailed description serve to further illustrate embodiments of concepts that include the claimed embodiments and explain various principles and advantages of those embodiments.

Figure 1:
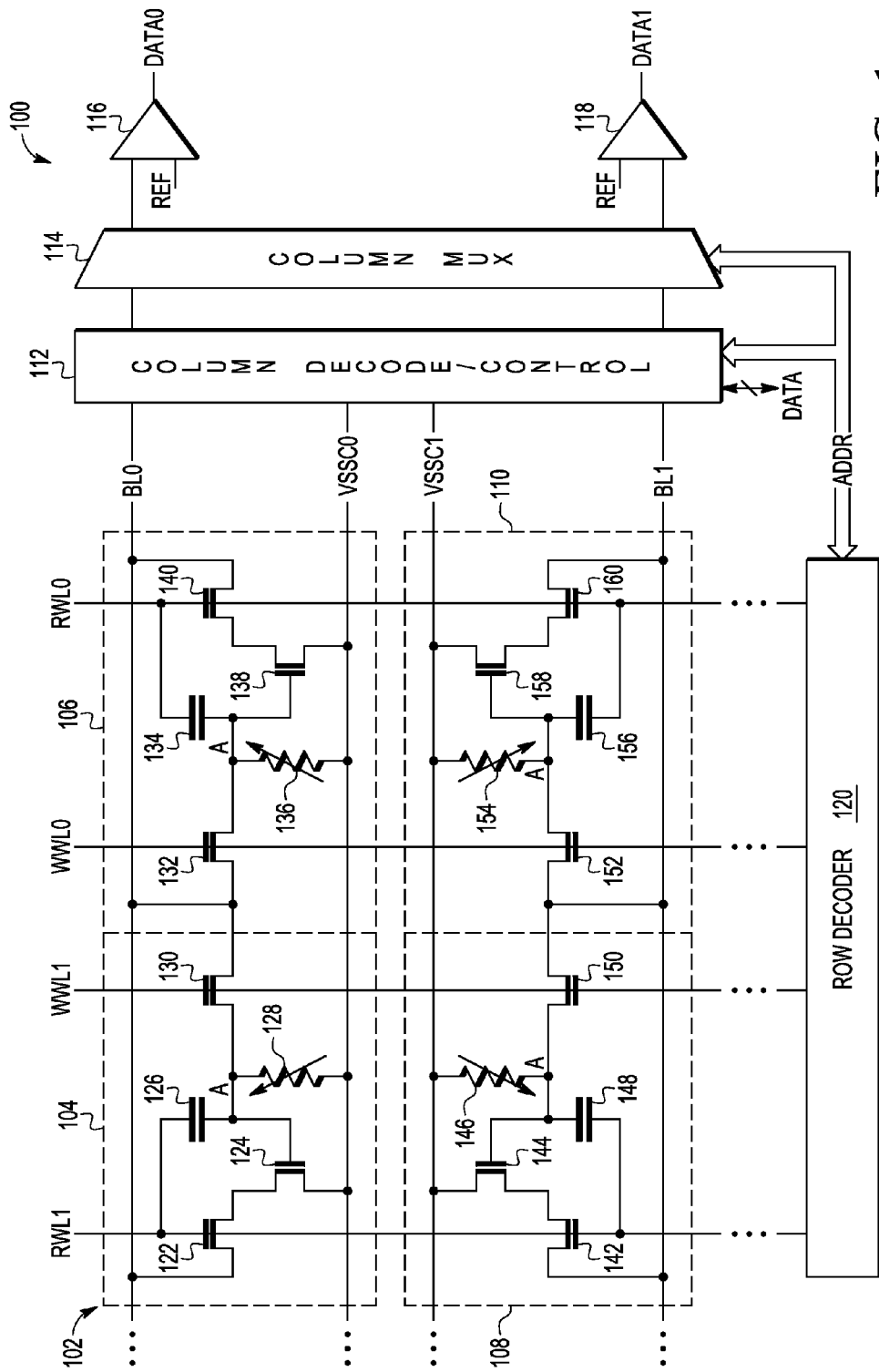
FIG. 1 is a schematic diagram illustrating a non-volatile memory array having bi-directional resistive elements and capacitive elements in accordance with an embodiment.

The present disclosure is illustrated by way of example and is not limited by the accompanying figures, in which like reference numbers indicate similar elements. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

The apparatus components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

Integrated circuit devices and methods are disclosed that utilize resistive storage elements operating bi-directionally as non-volatile storage with read speeds and space requirements comparable to conventional six transistor SRAM. A bi-directional resistive memory element (also referred to herein as a resistive element) can be changed between a high resistive state (HRS) and a low resistive state (LRS), and the state of the resistive element produces a robust zero or one logic state to be sensed. Memory cells include a resistive element having a first terminal directly connected to a column-wise power supply (VSSC), also referred to herein as a power rail, and a second terminal coupled to an internal node. The resistive element can be "programmed" to the HRS or to the LRS, depending on the desired logic state to be stored.

At least one embodiment of the memory cells also includes: a write transistor coupled between a write bitline and the internal node and controlled by a write wordline; and a one or two-transistor read circuit coupled between a read bitline and a power rail or a read wordline, with the read circuit being actuated by the read wordline through a capacitive element that is coupled between the internal node and the read wordline. The write transistor is used to provide a voltage or a current to program the resistive element to the HRS or the LRS for a write operation and to recharge the capacitive element in preparation for a read operation. The read circuit either discharges the read bitline or fails to discharge the read bitline based on the state of the resistive element. Particularly, the capacitive element couples the internal node high when the read wordline rises. The resistive element discharges quickly in the LRS; and the resistive element discharges slowly in the HRS allowing time for the read bitline to discharge.

FIG. 1 is a block diagram of an integrated circuit device including a non-volatile memory (NVM) device or simply memory 100 according to one embodiment. NVM device 100 includes NVM array 102 with a plurality of memory cells 104, 106, 108, 110 coupled to column decode/control 112, column multiplexer 114, sense amplifiers 116, 118, and row decoder 120. Sense amplifiers 116, 118 are coupled to column decode/control 112 by column multiplexer 114. Row decoder 120, column decode/control 112, and column multiplexer 114 can receive addresses for read and write requests from a data processor (not shown). Data to be written to memory array 102 is provided from the processor to column decode/control 112; and the data is written into or read from the NVM array 102 via column decode/control 112.

Read wordlines $RWL_{0-1}$ (i.e., wordlines used during the read operation) and write wordlines $WWL_{0-1}$ (i.e., wordlines used during the write operation) are coupled between row decoder 120 and memory array 102. Bitlines $BL_{0-1}$ are coupled between the memory cells 104, 106, 108, and 110 and sense amplifiers 116, 118 by way of column multiplexer 114. In the present embodiment, each bitline BL0 and BL1 serves as both a read bitline (i.e., a bitline for the read operation) and a write bitline (i.e., a bitline for the write operation). In other words, the read bitline and the write bitline are the same bitline. Power rails $VSSC_{0-1}$ couple between the column decode/control 112 and the memory cells 104, 106, 108, 110. Sense amplifiers 116, 118 provide data (e.g., Data0 and Data1, respectively) from memory array 102 to one or more processors. Although device 100 is shown with four memory cells 104, 106, 108, 110, two read and write wordlines, two bitlines, two power rails, and two sense amplifiers, device 100 can include any suitable number of memory cells, wordlines, bitlines, power rails, and sense amplifiers.

NVM device 100 may be implemented as part of a System On Chip (SOC) or other integrated circuit device, which includes at least one processor coupled to the NVM device 100 via an appropriate interface (not shown), such as a bus or the like with multiple signals or bits. The integrated circuit device may include other circuits, modules, or devices, such as other memory devices (not shown), other functional modules (not shown), and external interfaces, such as input, output, or input/output (I/O) ports or pins or the like (not shown). Accordingly, in one embodiment, the NVM device 100 is implemented alone in an integrated circuit without any other devices. In another embodiment, the NVM device 100 is part of a larger system on the integrated circuit.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element, and two or more signals can be multiplexed, modulated, or otherwise distinguished even though received or output at a common node. The terms "connected" and "coupled" are used herein in the claims and/or when describing the example circuit embodiments shown within the drawings. A node or feature that is "coupled" can be either directly or indirectly joined to or in direct or indirect communication with another node or feature. A node or feature that is "connected" is directly joined to or is in direct communication with another node or feature. Moreover, the various circuit schematics shown herein depict certain components, elements, features, or nodes as being directly connected. However, additional intervening elements, devices, features, or components may be present in an actual embodiment or in additional embodiments, assuming that the functionality of the given circuit is not adversely affected.

Memory cell 104 includes first and second N-channel access transistors 122, 130, a data storing bi-directional resistive element 128, an N-channel discharge or pull-down transistor 124, and a capacitive element 126. As depicted, access transistor 122 has a first current electrode connected to bitline BL0, a second current electrode connected to a first current electrode of pull-down transistor 124, and a control electrode connected to read wordline RWL1. Access transistor 130 has a first current electrode connected to bitline BL0, a second current electrode connected to internal node A (also referred to as a data storage node), and a control electrode connected to write wordline WWL1. Pull-down transistor 124 has a second current electrode connected to voltage supply VSSC0 and a control electrode connected to the internal node A of memory cell 104. Resistive element 128 has a cathode terminal connected to internal node A and an anode terminal connected to voltage supply VSSC0. Capacitive element 126 has a first terminal connected to the read wordline RWL1 and a second terminal connected to internal node A.

Memory cell 106 includes first and second N-channel access transistors 132, 140, a data storage bi-directional resistive element 136, an N-channel discharge or pull-down transistor 138, and a capacitive element 134. Access transistor 132 has a first current electrode connected to bitline BL0, a second current electrode connected to the internal node A of memory cell 106, and a control electrode connected to write wordline WWL0. Access transistor 140 has a first current electrode connected to bitline BL0, a second current electrode connected to a first current electrode of pull-down transistor 138, and a control electrode connected to read wordline RWL0. Discharge or pull-down transistor 138 has a second current electrode connected to power supply rail VSSC0 and a control electrode connected to internal node A. Resistive element 136 has a cathode terminal connected to internal node A and an anode terminal connected to voltage supply VSSC0. Capacitive element 134 has a first terminal connected to the read wordline RWL0 and a second terminal connected to internal node A.

Memory cell 108 includes first and second N-channel access transistors 142, 150, a data storing bi-directional resistive element 146, an N-channel discharge or pull-down transistor 144, and a capacitive element 148. Access transistor 142 has a first current electrode connected to bitline BL1, a second current electrode connected to a first current electrode of pull-down transistor 144, and a control electrode connected to read wordline RWL1. Access transistor 150 has a first current electrode connected to bitline BL1, a second current electrode connected to internal node A of memory cell 108, and a control electrode connected to write wordline WWL1. Discharge transistor 144 has a second current electrode connected to voltage supply VSSC1 and a control electrode connected to internal node A. Resistive element 146 has a cathode terminal connected to internal node A and an anode terminal connected to voltage supply VSSC1. Capacitive element 148 has a first terminal connected to the read wordline RWL1 and a second terminal connected to internal node A.

Memory cell 110 includes first and second N-channel access transistors 152, 160, a data storing bi-directional resistive element 154, an N-channel discharge or pull-down transistor 158, and a capacitive element 156. Access transistor 152 has a first current electrode connected to bitline BL1, a second current electrode connected to internal node A of memory cell 110, and a control electrode connected to write wordline WWL0. Access transistor 160 has a first current electrode connected to bitline BL1, a second current electrode connected to a first current electrode of pull-down transistor 158, and a control electrode connected to read wordline RWL0. Discharge or pull-down transistor 158 has a second current electrode connected to power supply VSSC1 and a control electrode connected to internal node A. Resistive element 154 has a cathode terminal connected to internal node A and an anode terminal connected to voltage supply VSSC1. Capacitive element 156 has a first terminal connected to the read wordline RWL0 and a second terminal connected to internal node A.

Bi-directional resistive elements 128, 136, 146, and 154 are used as non-volatile storage for the data in memory cells 104, 106, 108, and 110, respectively. As mentioned above, the anode of resistive elements 128, 136, 146, 154 is connected to a respective one of voltage supply VSSC0 or VSSC1, and the cathode of resistive elements 128, 136, 146, and 154 is connected to a respective internal node A.

When reading a resistive element, the resistive element can be detected to be in the HRS or the LRS. During the read operation, the read bitline is connected to a sense amplifier, which provides the output, e.g., Data0 or Data1, of a give memory cell. The read bitline is precharged, and the degree to which the bitline is discharged during the read operation depends on the data stored on the resistive element of the memory cell. To write resistive element 128, 136, 146, or 154 to the HRS, the anode is taken positive relative to the cathode by applying a positive bias to VSSC and pulling the internal node A low through access transistor 130, 132, 150, or 152, respectively. To write resistive element 128, 136, 146, or 154 to the LRS, the cathode is taken positive relative to the anode by applying a negative bias to VSSC and coupling the internal node A to a positive voltage through access transistor 130, 132, 150, or 152, respectively.

As used herein, it is assumed that if the resistive element of a memory cell is in the HRS, the memory cell stores a logic level "0" and if in the LRS, the memory cell stores a logic level "1". However, alternatively, the LRS may correspond to storing a logic level "0" and the HRS to storing a logic level "1". Other embodiments may reverse the orientation of the anode and cathode for the resistive elements, and the biases applied for writing to HRS and LRS would be adjusted accordingly.

Figure 2:
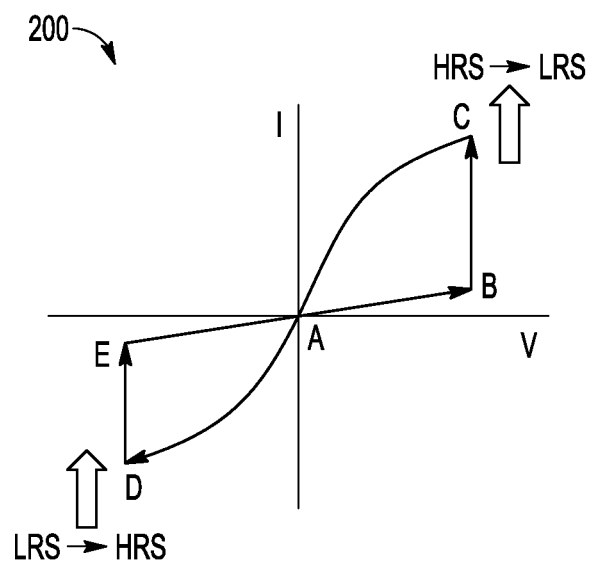
FIG. 2 is a diagram showing states of a resistive element of a memory cell of the memory array of FIG. 1.

FIG. 2 is a diagram 200 showing states of a resistive element, for example resistive element 128 of memory cell 104 in the memory array 102 of FIG. 1 in accordance with one embodiment. In state A, the current and voltage are approximately zero, and the resistance is in the high resistive state. As voltage increases along the positive x-axis, the current remains low until the voltage reaches a level at state B that causes the resistive element 128 to shift from the HRS to the low resistive state at state C. With resistive element 128 in the LRS, current varies monotonically with voltage and may not be linearly proportional. In the diagram shown, as voltage decreases to a negative value at state D, current has also decreased to a negative value. At state D, the voltage and current reach a level that causes resistive element 128 to change from the LRS to the HRS, shown as state E in FIG. 2. With resistive element 128 in the HRS, current barely changes with increases in voltage, as shown with current remaining close to zero along the y-axis as voltage varies from a lowest to a highest value from state E to state A, and from state A to state B.

Figure 3:
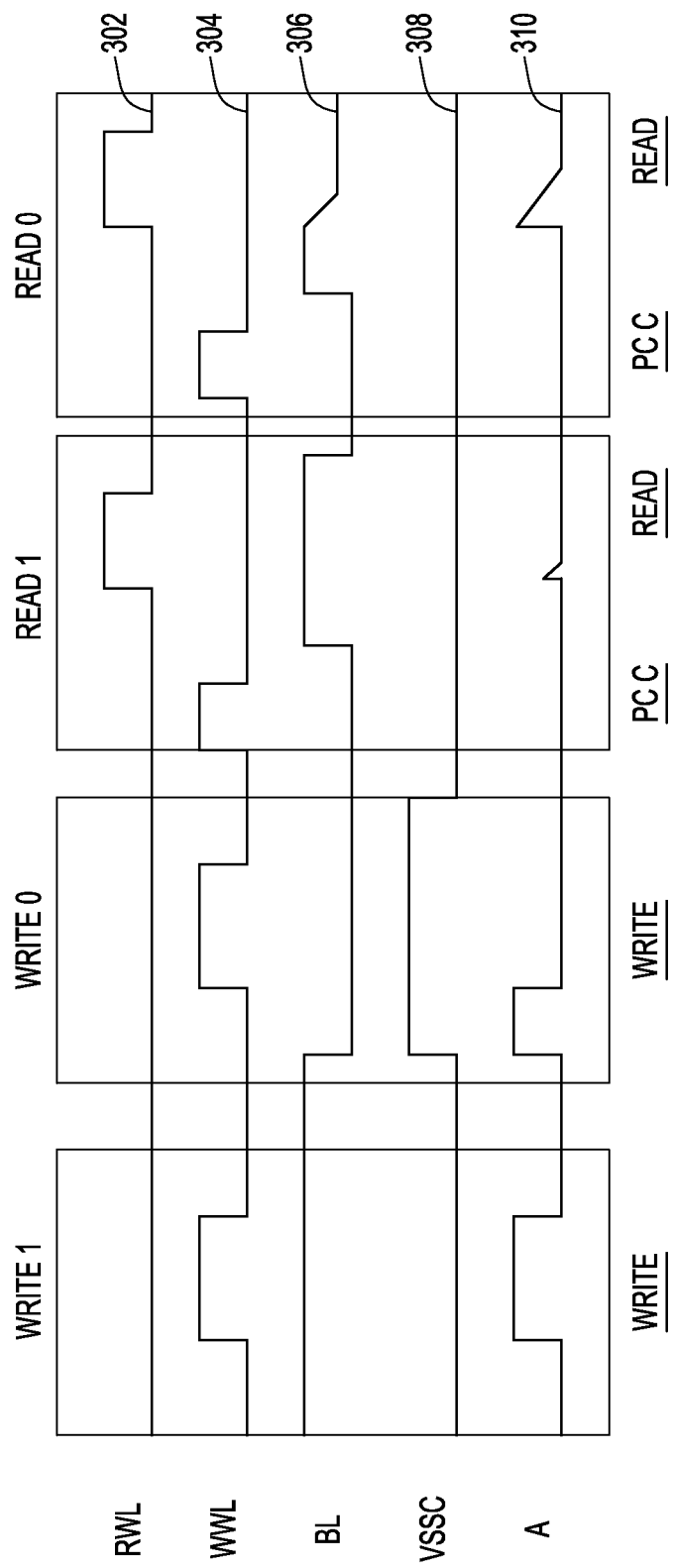
FIG. 3 is a timing diagram showing states of signals in a memory cell of the memory array of FIG. 1 and of a memory array of FIG. 9 during write, precharge, and read operations.

FIG. 3 is a timing diagram showing states of signals in a memory cell, such as the memory cell 106 in the memory array 102 of FIG. 1, during write, precharge, and read operations in accordance with an embodiment. Note that while write "1", write "0", read "1", and read "0" states are shown as starting immediately after the previous state ends, it is likely that some time passes between states. Moreover, the various signals 302 for RWL, 304 for WWL, 306 for BL, 308 for VSSC, and 310 for node A may take different intermediate values during time intervals between states that are not shown in FIG. 3. Additionally, the voltages applied to the RWL, WWL, BL, and VSSC during the read and write operations for a memory cell are also referred to herein as biasing voltage.

Referring to FIGS. 1 and 3, to write a "1" in the selected memory cell 106, FIG. 3 shows that bitline BL0 is taken to a high voltage, for example 2 Volts, to bias the drain of the access transistor 132. Write wordline WWL0 is turned on to pass the high voltage or at least a portion of the high voltage to internal node A. VSSC0 is held at a low voltage, e.g., grounded at 0 Volts, to place a positive voltage across the resistive element 136. This results in a current flowing down from internal node A through resistive element 136 to VSSC0, thus switching resistive element 136 from the HRS to the LRS.

To write a "0" in the selected memory cell 106, bitline BL0 is taken low, for example, 0 Volts. Write wordline WWL0 is turned on to pass 0 Volts or substantially 0 Volts to internal node A. VSSC0 is taken to supply voltage, for example 2 Volts, to place a negative voltage across the resistive element 136. This results in a current flowing up from VSSC0 through resistive element 136 to internal node A, which switches resistive element 136 from the LRS to the HRS. The signal 310 on node A shows a momentary high value at the beginning of the write operation. This is an artifact that is due to a time difference, as shown, between when VSSC0 is taken high and when the WWL0 is turned on.

The data storage state is determined by the state HRS or LRS of resistive element 136. Typically, the HRS, e.g., a 1 mega ohm resistance value, is about two to more than ten times higher than the LRS, e.g., a 10 kilo ohms resistance value. Therefore, for a write of the two different logic states, current is provided through resistive element 136 in opposite directions. That is, current in a first direction results in a logic level "1" being stored and current in a second and opposite direction results in a logic level "0" being stored.

Additionally, a benefit of memories in accordance with embodiments of the present teachings is the ability to select a single memory cell for a write operation in order to minimize power consumption in the memory device. Namely, memory cell selection is accomplished by appropriately biasing the power supply and the write bitline, according to the data to be written to the cell, to select the column of the memory cell. The appropriate write wordline is biased to select the row of the memory cell and to activate the corresponding access transistor for the selected memory cell. Memory cells can be deselected by placing the same voltage at both terminals of the resistive element of the memory cell by coupling VSSC and BL to the same voltage, for example VSS.

In this embodiment, to read memory cell 106, the capacitive element 134 is first precharged through transistor 132. For the precharge portion (labeled PC C) of the read operation, the write wordline WWL0 is asserted or pulsed, while holding the BL0, RWL0, and VSSC0 low. This momentarily places 0 Volts across both terminals of the capacitive element 134 to minimize or eliminate any charge on the capacitive element 134, thereby minimizing or eliminating charge leakage that could negatively impact the read operation over time. After the precharge is complete, WWL0 is de-asserted, thus turning off transistor 132. In some embodiments, resistance values, capacitance values, and timing may be compatible to fully discharge node A through resistive element 136, and the precharge phase may be omitted.

In order to perform the read operation, bitline BL0 is precharged to a positive voltage, and read word line RWL0 is asserted, while holding VSSC0 low. When RWL0 is asserted, discharge of the bitline BL0 correlates to the RC time constant resulting from the product of the resistance value of the resistive element 136 and the capacitance value of the capacitive element 134. Namely, where the resistive element is in the LRS (e.g., programmed to a logic level "1"), the RC time constant is shorter, and there is basically no discharge to BL0. However, where the resistive element is in the HRS (e.g., programmed to a logic level "0"), the RC time constant is longer, and there can be a significant discharge to BL0. In this manner a level of discharge (in this case no discharge) on the bitline BL0, resulting from the capacitive value of the capacitive element 134 and the resistive value of resistive element 136, indicates a logic level "1" or "0" stored on the resistive element 136.

Accordingly, the RC time constant can be tuned to the value needed to read the memory cell correctly. This enables the read circuit to be implementable over a large range of resistive values. Additionally, there is no need to bias power busses connected to multiple memory cells, as in some related art, in order to read the data of a single memory cell. Instead, you dynamically select the column of the memory cell by charging the appropriate bitline. The appropriate row of the memory cell is selected by asserting the appropriate read wordline. This dynamically biases the resistive element of the selected memory cell through the capacitive element of the memory cell. Discharge of the bitline, and hence the drawing of a dynamic transient current in the circuit, only occurs for the selected row corresponding to the asserted read wordline. No current is drawn on the unselected rows.

For a first read operation example, a "1" is stored in memory cell 106, corresponding to the resistive element 136 being in a LRS. After precharging the capacitive element 134, the bitline BL0 is precharged high. Then the read wordline RWL0 is pulsed high, which turns on the transistor 140. Node A begins to be capacitively coupled toward the voltage on RWL0. However, since node A is also connected to VSSC0 (which is held low) through resistive element 136 having the LRS, the coupling is short-lived.

More specifically, as the node A begins to rise, charge leaks off through the resistive element 136. The discharge of node A follows the RC time constant, which resulting from the product of the resistance value of the resistive element 136 and the capacitance value of the capacitive element 134. In the LRS, the resistance value of the resistive element 136 is smaller, which results in a shorter RC time constant. Thus, as node A rises towards the high voltage on RWL0, node A gets quickly pulled back to ground through the resistive element 136, resulting in only a transient change in the voltage on node A during the time that the RWL0 is pulsed high. Since node A stays below the threshold voltage of transistor 138, this transistor remains off, and the bitline BL0 is not discharged, or there is substantially no discharge of the bitline BL0. The high voltage level remaining on BL0 can be sensed by the sense amplifier 116 as a logic level "1" which corresponds to the LRS programmed onto the resistive element 136.

For a second read operation example, a "0" is stored in memory cell 106, corresponding to the resistive element 136 being in a HRS. After precharging the capacitive element 134, the bitline BL0 is precharged high. Then the read wordline RWL0 is pulsed high, which turns on the transistor 140. Node A begins to be capacitively coupled toward the voltage on RWL0. In this case, the RC time constant is longer since the resistance value of the resistive element 136 is larger. Accordingly, during the time that RWL0 is pulsed high, node A is coupled high enough to exceed the threshold voltage of the transistor 138 to turn on this transistor and complete a discharge path from the bitline BL0 to VSSC0. Node A is also coupled high enough for a long enough time to discharge BL0 to a resulting voltage level that can be sensed by the sense amplifier 116 as a logic level "0" which corresponds to the LRS programmed onto the resistive element 136.

Figure 4:
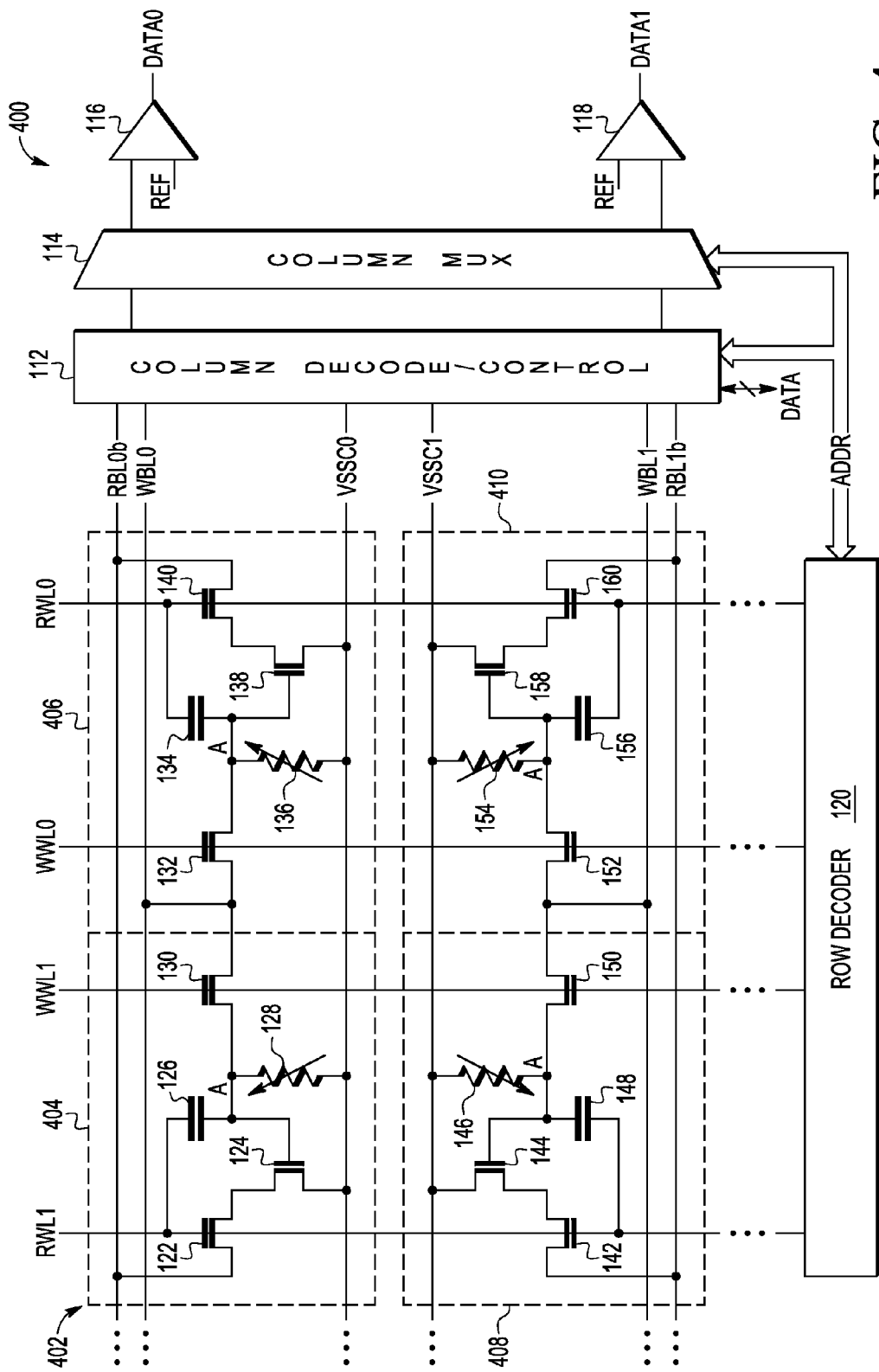
FIG. 4 is a schematic diagram illustrating a non-volatile memory array having bi-directional resistive elements and capacitive elements in accordance with another embodiment.

FIG. 4 is a schematic diagram of a dual port integrated circuit or memory device 400 that includes a memory array 402 with a plurality of memory cells 404, 406, 408, 410 coupled to column decode/control 112, column multiplexer 114, sense amplifiers 116, 118, and row decoder 120. Memory array 402 has a structure and function that is similar to memory array 102 shown in and described for FIG. 1.

Accordingly, memory cell 404 includes first and second N-channel access transistors 122, 130, the data storing bi-directional resistive element 128, the N-channel discharge or pull-down transistor 124, and the capacitive element 126 having similar connectivity as in memory cell 104 of FIG. 1. Memory cell 406 includes first and second N-channel access transistors 132, 140, the data storage bi-directional resistive element 136, the N-channel discharge or pull-down transistor 138, and the capacitive element 134 having similar connectivity as in memory cell 106 of FIG. 1. Memory cell 408 includes first and second N-channel access transistors 142, 150, the data storing bi-directional resistive element 146, the N-channel discharge or pull-down transistor 144, and the capacitive element 148 having similar connectivity as in memory cell 108 of FIG. 1. Memory cell 410 includes first and second N-channel access transistors 152, 160, the data storing bi-directional resistive element 154, the N-channel discharge or pull-down transistor 158, and the capacitive element 156 having similar connectivity as in memory cell 110 of FIG. 1.

The difference between memory cells 104, 106, 108, 110 and memory cells 404, 406, 408, 410 is that the latter are coupled to respective read bitlines RBL0b, RBL1b and write bitlines WBL0, WBL1 instead of just one respective bitline BL0, BL1 as shown in FIG. 1. Note that the "b" following a signal name denotes the complement of the signal. In particular, the first current electrodes of transistors 130, 132 are connected to the write bitline WBL0b, and the first current electrodes of transistors 150, 152 are connected to the write bitline WBL1b. The first current electrodes of transistors 122, 140 are connected to the read bitline RBL0b, and the first current electrodes of transistors 142, 160 are connected to the read bitline RBL1b. Separating the bitlines BL0, BL1 into read and write bitlines RBL0b, RBL1b, WBL0, WBL1 allows read operations to be performed faster than a memory cell with a single port cell since capacitance loading of the write transistors 130, 132, 150, 152 is removed from the read bitlines RBL0, RBL1. A further advantage of the memory device 400 is that the read bitlines are independent of the write bitlines so concurrent read and write operations within a block of memory cells is supported to different column addresses where columns deselected for write have bitline and VSSC both coupled to VSS.

Figure 5:
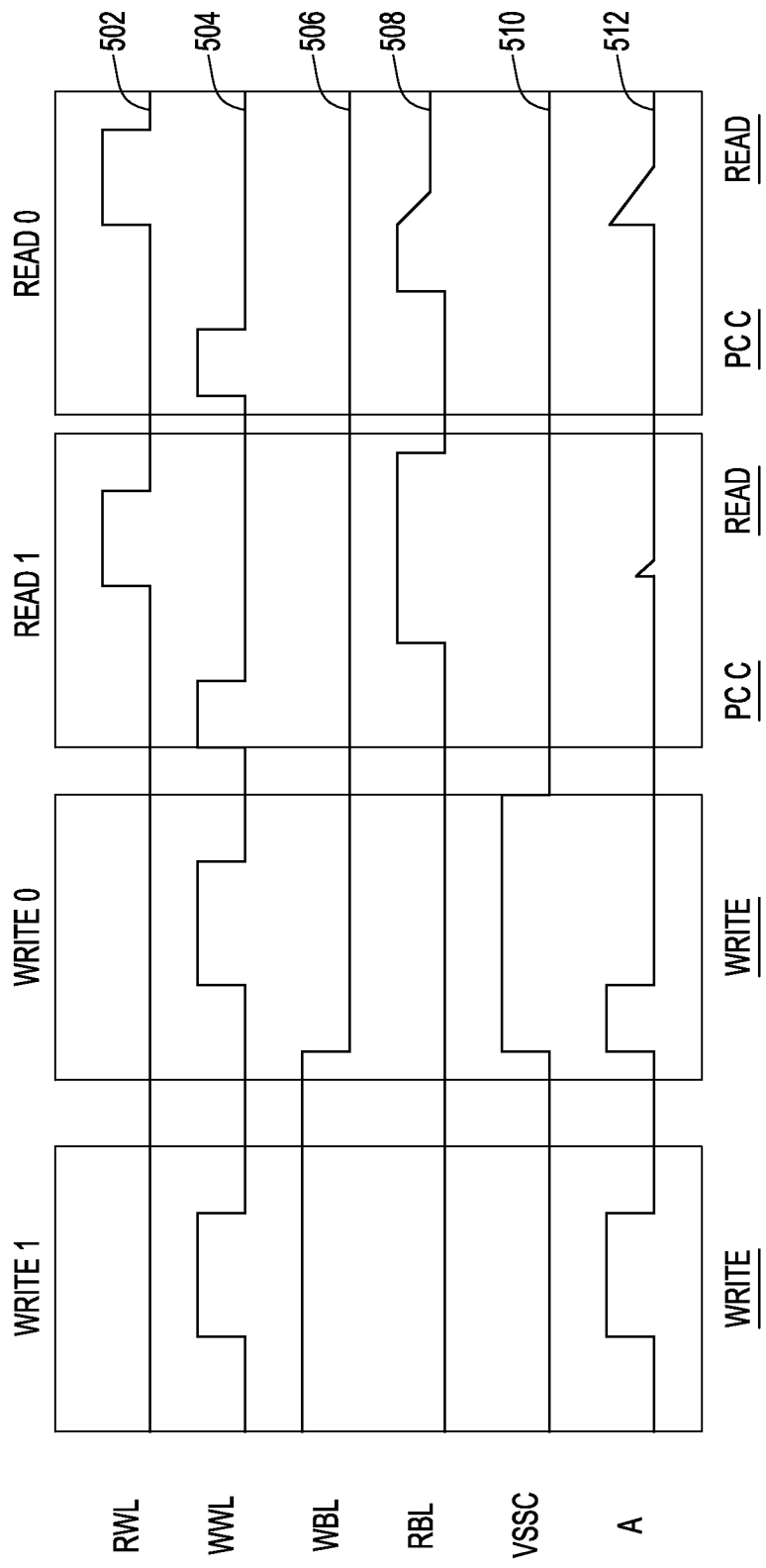
FIG. 5 is a timing diagram showing states of signals in a memory cell of the memory array of FIG. 4 and of a memory array of FIG. 6 during write, precharge, and read operations.

FIG. 5 is a timing diagram showing states of signals in a memory cell, such as the memory cell 406 in the memory array 402 of FIG. 4, during write, precharge, and read operations in accordance with an embodiment. The states of signals 502, 504, 506, 508, 510, 512 shown in FIG. 5 and the resulting write, precharge, and read operations are similar to the states of the signals 302, 304, 306, 308, and 310 shown in FIG. 3 and the resulting write, precharge, and read operations. The difference is that the BL signal 306 shown in FIG. 3 is separated into two bitline signals 506, 508 shown in FIG. 5.

Accordingly, referring to FIGS. 4 and 5, to write a "1" in the selected memory cell 406, FIG. 5 shows that write bitline WBL0 is taken to a high voltage, for example 2 Volts, to bias the drain of the access transistor 132. Write wordline WWL0 is turned on to pass the high voltage or at least a portion of the high voltage to internal node A. VSSC0 is held at a low voltage, e.g., grounded at 0 Volts, to place a positive voltage across the resistive element 136. This results in a current flowing down from internal node A through resistive element 136 to VSSC0, thus switching resistive element 136 from the HRS to the LRS.

To write a "0" in the selected memory cell 406, the write bitline WBL0 is taken low, for example, 0 Volts. Write wordline WWL0 is turned on to pass 0 Volts or substantially 0 Volts to internal node A. VSSC0 is taken to supply voltage, for example 2 Volts, to place a negative voltage across the resistive element 136. This results in a current flowing up from VSSC0 through resistive element 136 to internal node A, which switches resistive element 136 from the LRS to the HRS. The signal 512 on node A shows a momentary high value at the beginning of the write operation. This is artifact that is due to a time difference, as shown, between when VSSC0 is taken high and when the WWL0 is turned on.

To read memory cell 406, the capacitive element 134 is first precharged through transistor 132 similarly to what is shown in and described by reference to FIG. 3. After the precharge is complete, WWL0 is de-asserted, thus turning off transistor 132. To read a "1" stored in memory cell 406, corresponding to the resistive element 136 being in a LRS, the read bitline RBL0b is taken high. Then the read wordline RWL0 is pulsed high, which turns on the transistor 140. In the LRS, the resistance value of the resistive element 136 is smaller, which results in a shorter RC time constant. Thus, as node A rises towards the high voltage on RWL0, node A gets quickly pulled back to ground through the resistive element 136, resulting in only a transient change in the voltage on node A during the time that the RWL0 is pulsed high. Since the signal at node A is insufficient to turn on transistor 138, the read bitline RBL0b is not discharged, or there is substantially no discharge of RBL0b. The high voltage level remaining on RBL0b can be sensed by the sense amplifier 116 as a logic level "1" which corresponds to the LRS programmed onto the resistive element 136.

To read a "0" stored in memory cell 406, corresponding to the resistive element 136 being in a HRS, the read bitline RBL0b is taken high. Then the read wordline RWL0 is pulsed high, which turns on the transistor 140. Node A begins to be capacitively coupled toward the voltage on RWL0. In this case, the RC time constant is longer since the resistance value of the resistive element 136 is larger. Accordingly, during the time that RWL0 is pulsed high, node A is coupled high enough to turn on transistor 138 and complete a discharge path from the read bitline RBL0b to VSSC0. Node A is also coupled high enough for a long enough time to discharge RBL0b to a resulting voltage level that can be sensed by the sense amplifier 116 as a logic level "0" which corresponds to the LRS programmed onto the resistive element 136. In some embodiments, resistance values, capacitance values, and timing may be compatible to fully discharge node A through resistive element 136, and the precharge phase may be omitted.

Figure 6:
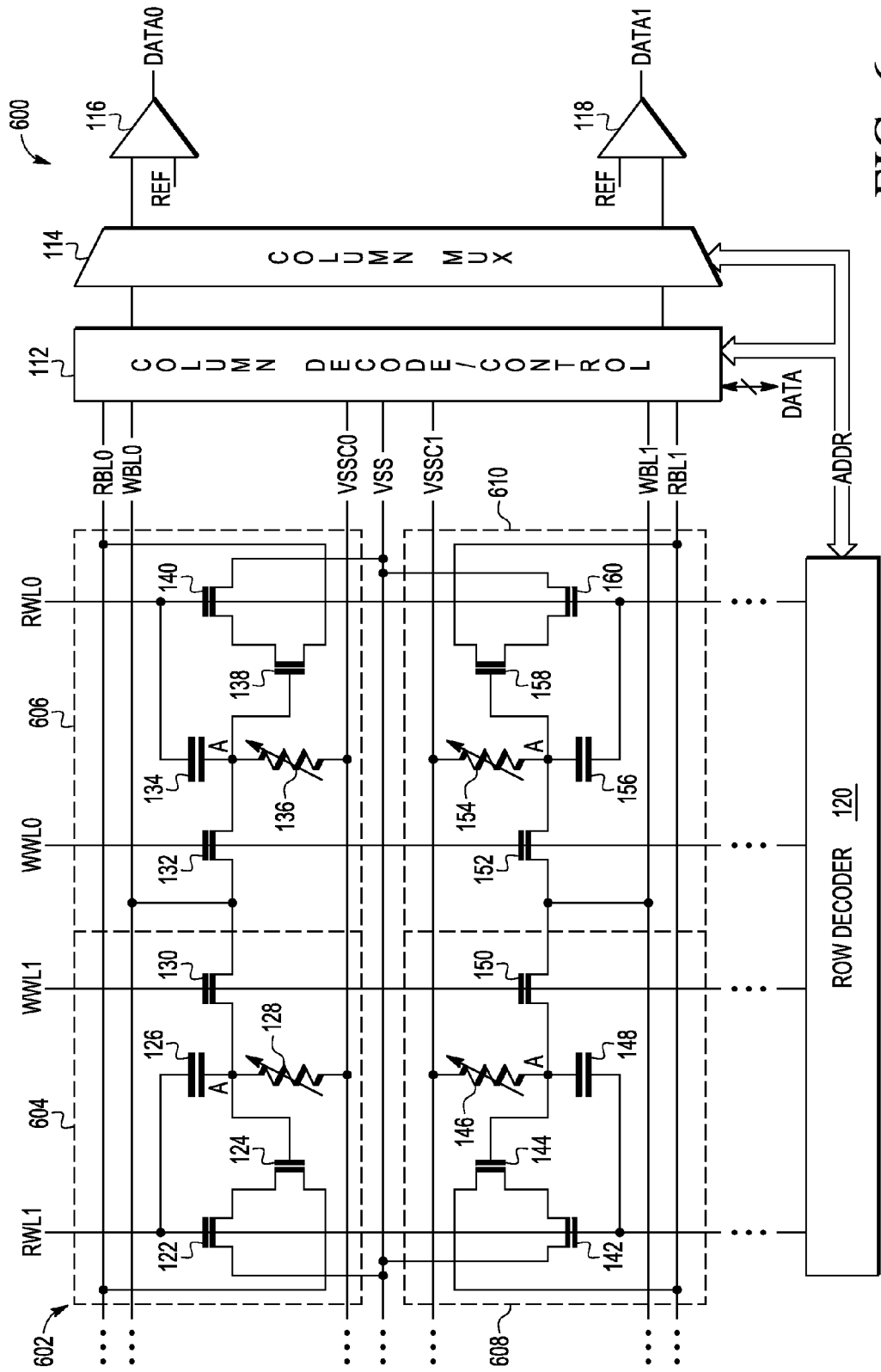
FIG. 6 is a schematic diagram illustrating a non-volatile memory array having bi-directional resistive elements and capacitive elements in accordance with another embodiment.

FIG. 6 is a schematic diagram of an integrated circuit or memory device 600 that includes a memory array 602 with a plurality of memory cells 604, 606, 608, 610 coupled to column decode/control 112, column multiplexer 114, sense amplifiers 116, 118, and row decoder 120. Memory array 602 has a structure and function that is similar to memory array 102 shown in and described for FIG. 1.

Accordingly, memory cell 604 includes first and second N-channel access transistors 122, 130, the data storing bi-directional resistive element 128, the N-channel discharge or pull-down transistor 124, and the capacitive element 126 having similar connectivity as in memory cell 104 of FIG. 1. Memory cell 606 includes first and second N-channel access transistors 132, 140, the data storage bi-directional resistive element 136, the N-channel discharge or pull-down transistor 138, and the capacitive element 134 having similar connectivity as in memory cell 106 of FIG. 1. Memory cell 608 includes first and second N-channel access transistors 142, 150, the data storing bi-directional resistive element 146, the N-channel discharge or pull-down transistor 144, and the capacitive element 148 having similar connectivity as in memory cell 108 of FIG. 1. Memory cell 610 includes first and second N-channel access transistors 152, 160, the data storing bi-directional resistive element 154, the N-channel discharge or pull-down transistor 158, and the capacitive element 156 having similar connectivity as in memory cell 110 of FIG. 1.

A difference between memory cells 104, 106, 108, 110 and memory cells 604, 406, 608, 610 is that three power rails VSS, VSSC0 and VSSC1 couple between the column decode/control 112 and the memory cells 604, 606, 608, 610 instead of the two power rails VSSC0 and VSSC1. Another difference is that memory cells 604, 606, 608, 610 are coupled to respective read bitlines RBL0, RBL1 and write bitlines WBL0, WBL1 instead of just one respective bitline BL0, BL1 as shown in FIG. 1. Additionally, current electrodes of the two read transistors in each memory cell of memory array 602 have reverse couplings between the read bitline and the power rail as compared to the memory array 102.

The resulting difference in connectivity includes the following. The first current electrode of transistors 130 and 132 are connected to WBL0, and the first current electrode of transistors 150 and 112 are connected to WBL1. The first current electrode of transistors 122, 140, 142, and 160 are all connected to VSS. The second current electrode of transistors 124 and 138 are connected to RBL0, and the second current electrode of transistors 144 and 158 are connected to RBL1. Accordingly, the discharge paths for the read circuit of memory cell 604, which includes transistors 122 and 124, and the read circuit of memory cell 606, which includes transistors 140 and 138, extend from RBL0 to VSS instead of from BL0 to VSS0. Similarly, the discharge paths for the read circuit of memory cell 608, which includes transistors 142 and 144, and the read circuit of memory cell 610, which includes transistors 160 and 158, extend from RBL1 to VSS instead of from BL1 to VSS1. Using the third power rail VSS reduces the capacitance of the VSSC lines, but requires another metal line to be connected into each memory cell such as memory cell 610. The importance of reversing the order of the transistors of the discharge path will be discussed later.

Additionally, the timing diagram of FIG. 5 also applies to the memory array 602 of FIG. 6, except that the additional power rail VSS, which is not shown in FIG. 3, is also held low during the write, precharge, and read operations. Otherwise, the write, precharge, and read operations of a memory cell of memory array 602, such as the memory cell 606, is as described above by reference to FIG. 4 and FIG. 5 for the write, precharge, and read operations for the memory cell 406. The language is not repeated here for the sake of brevity.

Figure 7:
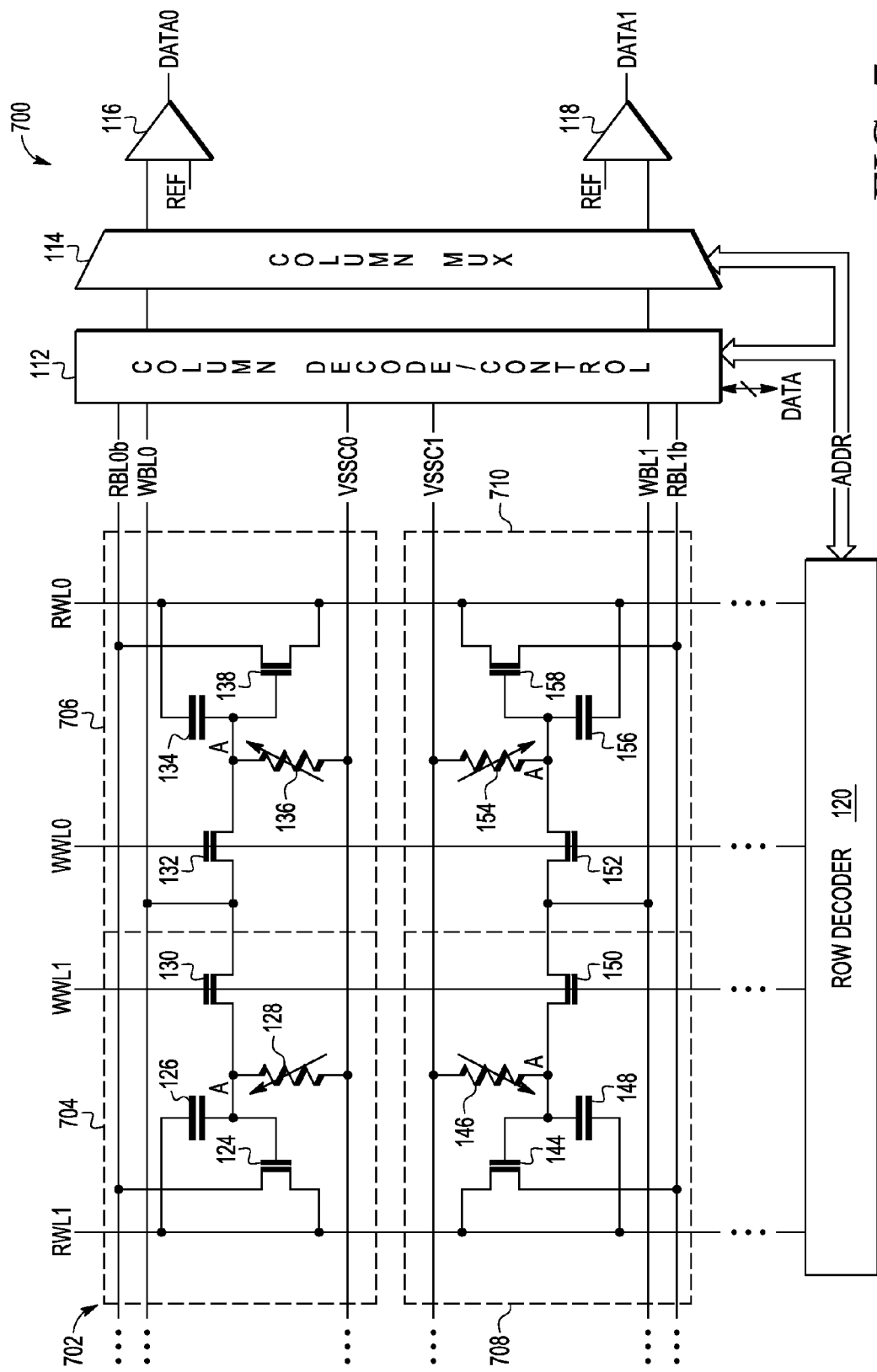
FIG. 7 is a schematic diagram illustrating a non-volatile memory array having bi-directional resistive elements and capacitive elements in accordance with another embodiment.

FIG. 7 is a schematic diagram of a dual port integrated circuit or memory device 700 that includes a memory array 702 with a plurality of memory cells 704, 706, 708, 710 coupled to column decode/control 112, column multiplexer 114, sense amplifiers 116, 118, and row decoder 120. Memory array 702 has a structure and function that is similar to memory array 102 shown in and described for FIG. 1. Differences between the memory arrays 102 and 702 are that:

the read circuit of each memory cell includes a single transistor instead of two transistors; and memory cells 704, 706, 708, 710 are coupled to respective read bitlines RBL0b, RBL1b and write bitlines WBL0, WBL1 instead of just one respective bitline BL0, BL1 as shown in FIG. 1. Note that the "b" following a signal name denotes the complement of the signal.

Accordingly, memory cell 704 includes the N-channel access transistor 130, the data storing bi-directional resistive element 128, the N-channel transistor 124, and the capacitive element 126 having similar connectivity as in memory cell 104 of FIG. 1. Memory cell 706 includes the N-channel access transistor 132, the data storage bi-directional resistive element 136, the N-channel transistor 138, and the capacitive element 134 having similar connectivity as in memory cell 106 of FIG. 1. Memory cell 708 includes the N-channel access transistor 150, the data storing bi-directional resistive element 146, the N-channel transistor 144, and the capacitive element 148 having similar connectivity as in memory cell 108 of FIG. 1. Memory cell 710 includes the N-channel access transistor 152, the data storing bi-directional resistive element 154, the N-channel transistor 158, and the capacitive element 156 having similar connectivity as in memory cell 110 of FIG. 1.

The resulting difference in connectivity includes the following. The first current electrodes of transistors 130, 132 are connected to the write bitline WBL0b, and the first current electrodes of transistors 150, 152 are connected to the write bitline WBL1b. The first current electrode of transistor 124 is connected to the read bitline RBL0b; the second current electrode of the transistor 124 is connected to the read wordline RWL1b; and the control electrode of transistor 124 is connected to node A. The first current electrode of transistor 138 is connected to the read bitline RBL0b; the second current electrode of the transistor 138 is connected to the read wordline RWL0b; and the control electrode of transistor 138 is connected to node A. The first current electrode of transistor 144 is connected to the read bitline RBL1b; the second current electrode of the transistor 144 is connected to the read wordline RWL1b; and the control electrode of transistor 144 is connected to node A. The first current electrode of transistor 158 is connected to the read bitline RBL1b; the second current electrode of the transistor 158 is connected to the read wordline RWL0b; and the control electrode of transistor 158 is connected to node A.

Figure 8:
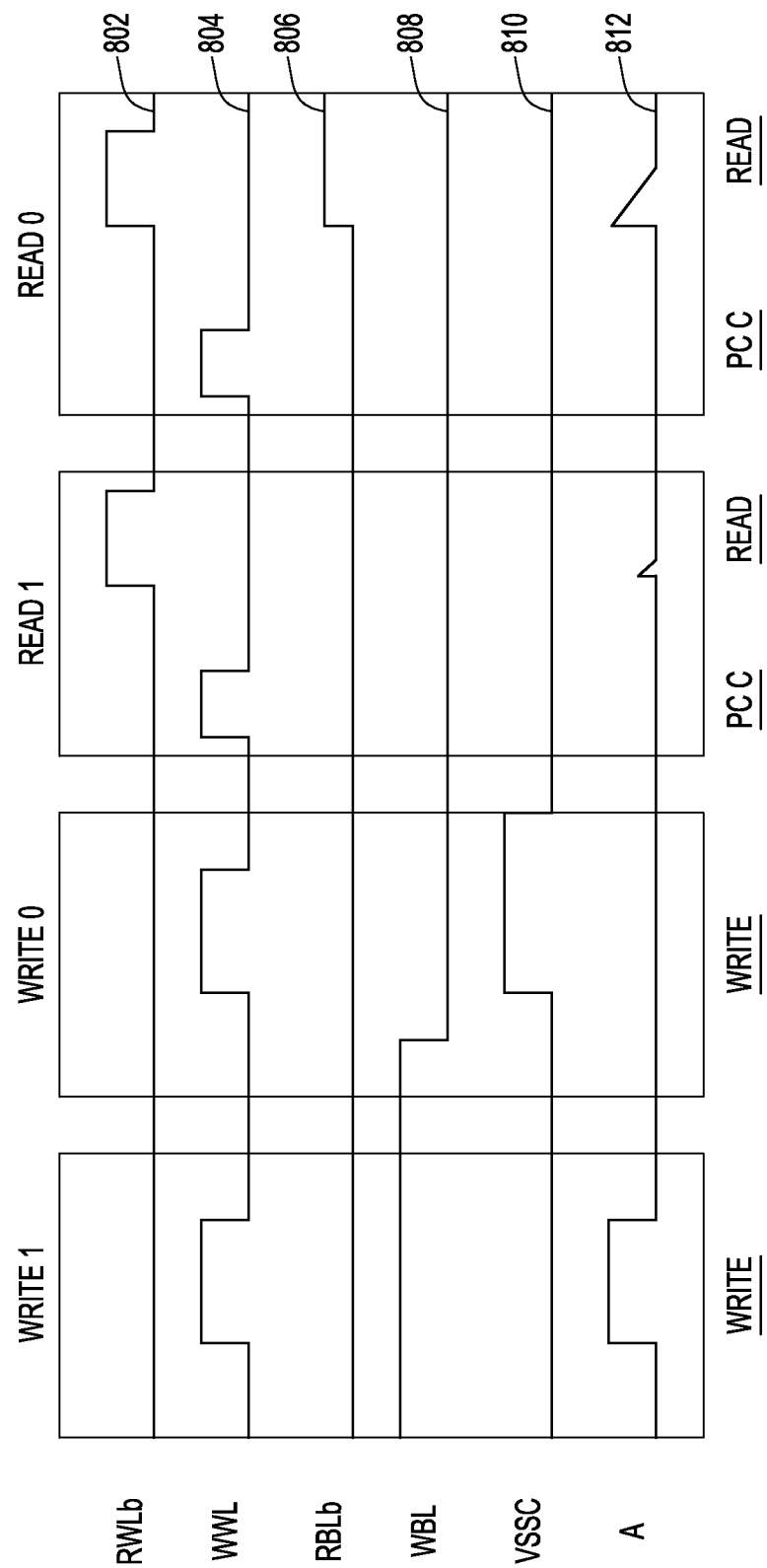
FIG. 8 is a timing diagram showing states of signals in a memory cell of the memory array of FIG. 7 during write, precharge, and read operations.

FIG. 8 is a timing diagram showing states of signals in a memory cell, such as the memory cell 706 in the memory array 702 of FIG. 7, during write, precharge, and read operations in accordance with an embodiment. The states of signals 802, 804, 806, 808, 810, 812 shown in FIG. 8 and the resulting write, precharge, and read operations are similar to the states of the signals 302, 304, 306, 308, and 310 shown in FIG. 3 and the resulting write, precharge, and read operations. A difference is that the BL signal 306 shown in FIG. 3 is separated into two bitline signals 506, 508 shown in FIG. 5. An additional difference is that the signal 806 for RBLb is precharged low instead of high with the result that the signal 806 is inverted for the read operation relative to signal 306 for BL in FIG. 3.

Accordingly, referring to FIGS. 7 and 8, to write a "1" in the selected memory cell 706, FIG. 8 shows that write bitline WBL0 is taken to a high voltage, for example 2 Volts, to bias the drain of the access transistor 132. Write wordline WWL0 is turned on to pass the high voltage or at least a portion of the high voltage to internal node A. VSSC0 is held at a low voltage, e.g., grounded at 0 Volts, to place a positive voltage across the resistive element 136. This results in a current flowing down from internal node A through resistive element 136 to VSSC0, thus switching resistive element 136 from the HRS to the LRS.

To write a "0" in the selected memory cell 706, the write bitline WBL0 is taken low, for example, 0 Volts. Write wordline WWL0 is turned on to pass 0 Volts or substantially 0 Volts to internal node A. VSSC0 is taken to supply voltage, for example 2 Volts, to place a negative voltage across the resistive element 136. This results in a current flowing up from VSSC0 through resistive element 136 to internal node A, which switches resistive element 136 from the LRS to the HRS.

To read memory cell 706, the capacitive element 134 is first precharged through transistor 132 similarly to what is shown in and described by reference to FIG. 3. After the precharge is complete, WWL0 is de-asserted, thus turning off transistor 132. To read a "1" stored in memory cell 706, corresponding to the resistive element 136 being in a LRS, the read bitline RBL0b is precharged low, and the read wordline RWL0 is pulsed high. In the LRS, the resistance value of the resistive element 136 is smaller, which results in a shorter RC time constant. Thus, as node A rises towards the high voltage on RWL0, node A gets quickly pulled back to ground through the resistive element 136, resulting in only a transient change in the voltage on node A during the time that the RWL0 is pulsed high. Since the signal at node A is insufficient to turn on transistor 138, the read bitline RBL0b is not charged, or there is substantially no charging of RBL0b. The low voltage level remaining on RBL0b can be sensed by the sense amplifier 116 as a logic level "1" which corresponds to the LRS programmed onto the resistive element 136.

To read a "0" stored in memory cell 706, corresponding to the resistive element 136 being in a HRS, the read bitline RBL0b is precharged low, and the read wordline RWL0 is pulsed high. Node A begins to be capacitively coupled toward the voltage on RWL0. In this case, the RC time constant is longer since the resistance value of the resistive element 136 is larger. Accordingly, during the time that RWL0 is pulsed high, node A is coupled high enough to turn on transistor 138 and complete a charging path from the read bitline RBL0b to RWL0b. Node A is also coupled high enough for a long enough time to charge RBL0b to a resulting higher voltage level that can be sensed by the sense amplifier 116 as a logic level "0" which corresponds to the LRS programmed onto the resistive element 136. In some embodiments, resistance values, capacitance values, and timing may be compatible to fully discharge node A through resistive element 136, and the precharge phase may be omitted.

Figure 9:
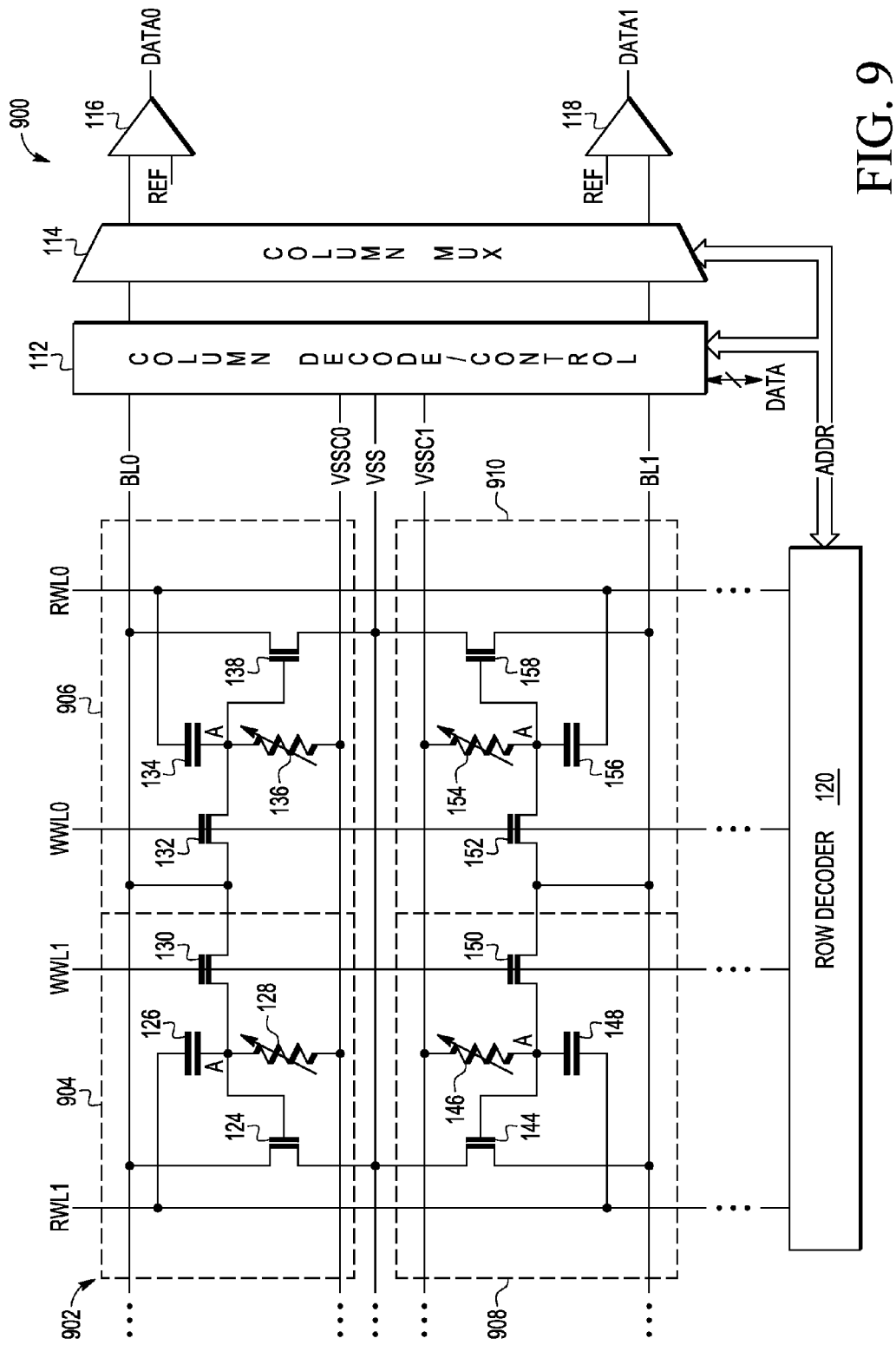
FIG. 9 is a schematic diagram illustrating a non-volatile memory array having bi-directional resistive elements and capacitive elements in accordance with another embodiment.

FIG. 9 is a schematic diagram of an integrated circuit or memory device 900 that includes a memory array 902 with a plurality of memory cells 904, 906, 908, 910 coupled to column decode/control 112, column multiplexer 114, sense amplifiers 116, 118, and row decoder 120. Memory array 902 has a structure and function that is similar to memory array 102 shown in and described for FIG. 1. Differences between the memory arrays 102 and 902 are that: the read circuit of each memory cell includes a single transistor instead of two transistors; and three power rails VSS, VSSC0 and VSSC1 couple between the column decode/control 112 and the memory cells 904, 906, 908, 910 instead of the two power rails VSSC0 and VSSC1.

Accordingly, memory cell 904 includes the N-channel access transistor 130, the data storing bi-directional resistive element 128, the N-channel discharge or pull-down transistor 124, and the capacitive element 126 having similar connectivity as in memory cell 104 of FIG. 1. Memory cell 706 includes the N-channel access transistor 132, the data storage bi-directional resistive element 136, the N-channel discharge or pull-down transistor 138, and the capacitive element 134 having similar connectivity as in memory cell 106 of FIG. 1. Memory cell 708 includes the N-channel access transistor 150, the data storing bi-directional resistive element 146, the N-channel discharge or pull-down transistor 144, and the capacitive element 148 having similar connectivity as in memory cell 108 of FIG. 1. Memory cell 710 includes the N-channel access transistor 152, the data storing bi-directional resistive element 154, the N-channel discharge or pull-down transistor 158, and the capacitive element 156 having similar connectivity as in memory cell 110 of FIG. 1.

The resulting difference in connectivity includes the following. The first current electrodes of transistors 124, 138 are connected to the bitline BL0; the second current electrodes of the transistors 124, 138 are connected to VSS; and the control electrodes of transistors 124, 138 are connected to the respective node A. The first current electrodes of transistors 146, 158 are connected to the bitline BL1; the second current electrodes of the transistors 146, 158 are connected to VSS; and the control electrodes of transistors 146, 158 are connected to the respective node A.

The timing diagram of FIG. 3 also applies to the memory array 902 of FIG. 9, except that: the additional power rail VSS, which is not shown in FIG. 3, is also held low during the write, precharge, and read operations; and the read operation is slightly different because of the single read transistor in the memory cells of memory array 902. Accordingly, the write and precharge operations of a memory cell of memory array 902, such as the memory cell 906, is as described above by reference FIG. 1 and FIG. 3 for the write and precharge operations for the memory cell 106. The language is not repeated here for the sake of brevity.

However, to read a "1" stored in memory cell 906, corresponding to the resistive element 136 being in a LRS, the bitline BL0 is precharged high, and the read wordline RWL0 is pulsed high. In the LRS, the resistance value of the resistive element 136 is smaller, which results in a shorter RC time constant. Thus, as node A rises towards the high voltage on RWL0, node A gets quickly pulled back to ground through the resistive element 136, resulting in only a transient change in the voltage on node A during the time that the RWL0 is pulsed high. Since the signal at node A is insufficient to turn on transistor 138, the read bitline BL0 is not discharged, or there is substantially no discharge of BL0. The high voltage level remaining on BL0 can be sensed by the sense amplifier 116 as a logic level "1" which corresponds to the LRS programmed onto the resistive element 136.

To read a "0" stored in memory cell 906, corresponding to the resistive element 136 being in a HRS, the bitline BL0 is precharged high, and the read wordline RWL0 is pulsed high. Node A begins to be capacitively coupled toward the voltage on RWL0. In this case, the RC time constant is longer since the resistance value of the resistive element 136 is larger. Accordingly, during the time that RWL0 is pulsed high, node A is coupled high enough to turn on transistor 138 and complete a discharge path from the bitline BL0 to VSS. Node A is also coupled high enough for a long enough time to discharge BL0 to a resulting voltage level that can be sensed by the sense amplifier 116 as a logic level "0" which corresponds to the LRS programmed onto the resistive element 136.

In accordance with various embodiments, for example as shown in FIG. 1, FIG. 4, FIG. 6, FIG. 7, and FIG. 9, a memory includes: a set of bitlines e.g., BL, WBL, RBL; a set of wordlines, e.g., WWL, RWL; a set of power rails, e.g., VSS, VSSC; an array, e.g., 102, 402, 602, 702, 902, of memory cells; column decode circuitry 112, 114 and sense circuitry 116, 118 coupled to the array of memory cells through the set of bitlines; and row decode circuitry 120 coupled to the array of memory cells through the set of wordlines. Each memory cell includes at least: a bi-directional resistive memory element, e.g., 128, 136, 146, 154, having a first terminal directly connected to a first power rail and a second terminal coupled to an internal node A; a first (read) transistor, e.g., 124, 138, 144, 158, having a control electrode coupled to the internal node, a first current electrode coupled to a first bitline, and a second current electrode coupled to one of the first power rail, a second power rail, or a read wordline; and a capacitive element, e.g., 126, 134, 148, 156 having a first terminal coupled to the internal node and a second terminal coupled to the read wordline. As further shown in FIG. 1, FIG. 4, FIG. 6, FIG. 7, and FIG. 9, each memory cell also includes a second (write) transistor, e.g., 130, 132, 150, 152 having a control electrode coupled to a write wordline, a first current electrode coupled to one of the first bitline or a second bitline, and a second current electrode coupled to the internal node.

In at least one of the memory cell embodiments, e.g., as shown in FIG. 7 and FIG. 9, the first current electrode of the first transistor is directly connected to the first bitline, and the second current electrode of the first transistor is directly connected to the read wordline or the second power rail. In other embodiments, e.g., as shown in FIG. 1, FIG. 4, FIG. 6, the first current electrode of the first transistor is coupled to the read bitline through a current electrode of a third (read) transistor, e.g., 122, 140, 142, 160 of the memory cells. The third transistor includes a control electrode coupled to the read wordline, a first current electrode coupled to the read bitline, and a second current electrode coupled to the first current electrode of the first transistor.

Different embodiments of capacitive elements and resistive elements are implementable. For some embodiments, the bi-directional resistive memory element is implemented as a resistive RAM (RRAM). For RRAM a MIM (metal insulator metal) capacitor can be formed over the active area of the cell to achieve capacitances to correspond to the relatively high resistance of the resistive memory resistor. For one example, the MIM capacitor is an unformed resistive memory resistor, and the bi-directional resistive memory element is a formed resistive memory resistor having a filament between the first and second terminals of the bi-directional resistive memory element. The "forming" process used to create these components is well known, the details of which are not included for the sake of brevity. In other embodiments the MIM capacitor may be formed in other ways. An advantage of this embodiment, is that the capacitive element and resistive element can be concurrently formed using a similar procedure, structure type, and materials, but with minimal added area to the memory cell.

For other embodiments, the bi-directional resistive memory element is implemented as a spin transfer torque magnetoresistive random-access memory resistor (STT MRAM), such as where the capacitive element may be implemented as a thin-oxide capacitor in order to achieve a larger capacitance corresponding to the smaller resistance of the resistive memory resistor. Where the resistive element requires a lower voltage, e.g., 1 Volt, to program such as with an STT MRAM, all of the transistors in the memory cell can have a thinner gate oxide, making them faster and more compact over a wide range of gate oxide thickness. However, where more voltage is needed to program the resistive element, such as with an RRAM, an advantageous embodiment is where the second (write) transistor has a thicker gate oxide and higher threshold voltage and can, thereby, withstand higher voltages than one or both of the first and second (read)

transistors. An example range of gate oxide thickness for the write transistor is 30 to 50 angstroms.

FIG. 6 illustrates an embodiment, where a thicker gate oxide write transistor can be used. Taking the memory cell 606 as an example, the write transistor 132 can be implemented with a thicker gate oxide than the gate oxide of one or even both of the read transistors 138, 140. The transistors 138, 140 can have a thinner gate oxide due to their "cascode" arrangement, within the memory cell 606. For example, when there is a high program voltage on node A (e.g., where resistive element 136 is programmed to the LRS) and BL0 is taken high, transistor 140 acts as a protection or "cascade" device for itself and transistor 138 from over-biasing due to the high voltage at node A. Transistor 140 applies the lower voltage of the RBL which about half of the higher voltage of node A to the drain of transistor 138 dividing the higher voltage across two transistors. Due to the divided voltage, neither transistor is subjected to the higher voltage at node A, and both transistors can, therefore, have a thinner gate oxide.

For yet another embodiment, a method is performed for operating a memory cell having a bi-directional resistive memory element having a first terminal directly connected to a power rail and a second terminal coupled to an internal node and a capacitive element having a first terminal coupled to the internal node and a second terminal coupled to one of a read wordline or a read bitline. The method includes, during a first write operation, applying first biasing voltages to the power rail, a write wordline, and a write bitline to program a first resistive state onto the bi-directional resistive memory element. The method further includes, during a first read operation: applying second biasing voltages to the power rail and a read wordline; and charging a read bitline, wherein a product of a resistance value of the bi-directional resistive memory element and a capacitance value of the capacitive element causes a level of discharge of the read bitline, thereby generating a resulting voltage on the read bitline that represents the first resistive state programmed onto the bi-directional resistive memory element. The method may include during the read operation and before charging the read bitline, precharging the capacitive element. The resulting voltage on the read bitline can be sensed using sensing circuitry to determine a first logic state, which corresponds to the first resistive state programmed onto the bi-directional resistive memory element.

In accordance with a further embodiment, the method includes, during a second write operation, applying third biasing voltages to the power rail, the write wordline, and the write bitline to program a second resistive state onto the bi-directional resistive memory element, wherein a first current through the bi-directional resistive memory element during the first write operation flows in an opposite direction than a second current that flows through the bi-directional resistive memory element during the second write operation. Additionally, the method can include, during a second read operation: applying fourth biasing voltages to the power rail and the read wordline; charging the read bitline, wherein the level of discharge of the read bitline and the resulting voltage on the read bitline represents the second resistive state programmed onto the bi-directional resistive memory element; and sensing the resulting voltage on the read bitline to determine a second logic state, which corresponds to the second resistive state programmed onto the bi-directional resistive memory element.

An example benefit of the disclosed embodiments is a relatively compact non-volatile memory cell, i.e., with two or three transistors, a resistive element, and a capacitive element, that can be read at speeds similar to a larger SRAM having 6 transistors. An additional example benefit includes that the memory cell operates at a very low power in standby and during write and read operations.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A memory cell comprising:
a bi-directional resistive memory element having a first terminal directly connected to a first power rail and a second terminal coupled to an internal node;
a first transistor having a control electrode coupled to the internal node, a first current electrode coupled to a first bitline, and a second current electrode coupled to one of the first power rail, a second power rail, or a read wordline; and
a capacitive element having a first terminal coupled to the internal node and a second terminal coupled to the read wordline.

2. The memory cell of claim 1, wherein the first current electrode of the first transistor is directly connected to the first bitline, and the second current electrode of the first transistor is directly connected to the read wordline or the second power rail.

3. The memory cell of claim 1 further comprising a second transistor that couples the first current electrode of the first transistor to the first bitline, wherein the second transistor has a control electrode coupled to the read wordline, a first current electrode coupled to the first bitline, and a second current electrode coupled to the first current electrode of the first transistor.

4. The memory cell of claim 1 further comprising a second transistor having a control electrode coupled to a write wordline, a first current electrode coupled to one of the first bitline or a second bitline, and a second current electrode coupled to the internal node.

5. The memory cell of claim 4 further comprising a third transistor having a control electrode coupled to the read wordline, a first current electrode coupled to the first bitline, and a second current electrode coupled to the first current electrode of the first transistor.

6. The memory cell of claim 4 further comprising a third transistor having a control electrode coupled to the read wordline, a first current electrode coupled to the second power rail, and a second current electrode coupled to the second current electrode of the first transistor, wherein the second current electrode of the first transistor is coupled to the second power rail through the third transistor.

7. The memory cell of claim 6, wherein the second transistor has a thicker gate oxide and higher threshold voltage than at least one of the first transistor or the third transistor.

8. The memory cell of claim 1, wherein the capacitive element is a metal-insulator-metal capacitor.

9. The memory cell of claim 8, wherein the metal-insulator-metal capacitor is an unformed resistive memory resistor, and the bi-directional resistive memory element is a formed resistive memory resistor having a filament between the first and second terminals of the bi-directional resistive memory element.

10. The memory cell of claim 1, wherein the capacitive element is a thin-oxide capacitor.

11. The memory cell of claim 10, wherein the bi-directional resistive memory element is a spin transfer torque magnetoresistive random-access memory resistor.

12. A method of operating a memory cell comprising a bi-directional resistive memory element having a first terminal directly connected to a power rail and a second terminal coupled to an internal node and a capacitive element having a first terminal coupled to the internal node and a second terminal coupled to one of a read wordline or a read bitline, the method comprising:
  during a first write operation:
    applying first biasing voltages to the power rail, a write wordline, and a write bitline to program a first resistive state onto the bi-directional resistive memory element;
  during a first read operation:
    applying second biasing voltages to the power rail and a read wordline;
    precharging a read bitline, wherein a product of a resistance value of the bi-directional resistive memory element and a capacitance value of the capacitive element causes a level of charge or discharge of the read bitline, thereby generating a resulting voltage on the read bitline that represents the first resistive state programmed onto the bi-directional resistive memory element.

13. The method of claim 12 further comprising sensing the resulting voltage on the read bitline to determine a first logic state, which corresponds to the first resistive state programmed onto the bi-directional resistive memory element.

14. The method of claim 12 further comprising, during the read operation and before precharging the read bitline, precharging the capacitive element.

15. The method of claim 12 further comprising:
  during a second write operation:
    applying third biasing voltages to the power rail, the write wordline, and the write bitline to program a second resistive state onto the bi-directional resistive memory element, wherein a first current through the bi-directional resistive memory element during the first write operation flows in an opposite direction than a second current that flows through the bi-directional resistive memory element during the second write operation.

16. The method of claim 15 further comprising:
  during a second read operation:
    applying fourth biasing voltages to the power rail and the read wordline;
    precharging the read bitline, wherein the level of charge or discharge of the read bitline and the resulting voltage on the read bitline represents the second resistive state programmed onto the bi-directional resistive memory element;
    sensing the resulting voltage on the read bitline to determine a second logic state, which corresponds to the second resistive state programmed onto the bi-directional resistive memory element.

17. A memory comprising:
  a set of bitlines;
  a set wordlines;
  a set of power rails;
  an array of memory cells, with each memory cell comprising:
    a bi-directional resistive memory element having a first terminal directly connected to a first power rail of the set of power rails and a second terminal coupled to an internal node;
    a first transistor having a control electrode coupled to the internal node, a first current electrode coupled to a read bitline of the set of bitlines, and a second current electrode coupled to the first power rail, a second power rail, or a read wordline of the set of wordlines; and
    a capacitive element having a first terminal coupled to the internal node and a second terminal coupled to the read wordline;
  column decode circuitry and sense circuitry coupled to the array of memory cells through the set of bitlines; and
  row decode circuitry coupled to the array of memory cells through the set of wordlines.

18. The memory of claim 17, wherein each memory cell further comprises a second transistor having a control electrode coupled to a write wordline of the set of wordlines, a first current electrode coupled to a write bitline of the bitlines, and a second current electrode coupled to the internal node.

19. The memory of claim 18, wherein the read bitline and the write bitline are the same bitline.

20. The memory of claim 18, wherein each memory cell further comprises a third transistor having a control electrode coupled to the read wordline, a first current electrode coupled to the read bitline, and a second current electrode coupled to the first current electrode of the first transistor.

* * * * *